United States Patent [19]

Kirkby

[11] 4,047,123
[45] Sept. 6, 1977

[54] DOUBLE HETEROSTRUCTURE LASERS HAVING REDUCED MICROSTRESS

[75] Inventor: Paul Anthony Kirkby, Harlow, England

[73] Assignee: International Standard Electric Corporation, New York, N.Y.

[21] Appl. No.: 615,320

[22] Filed: Sept. 22, 1975

[30] Foreign Application Priority Data

Sept. 26, 1974 United Kingdom ............... 41896/74

[51] Int. Cl.² .............................................. H01S 3/19
[52] U.S. Cl. ................................. 331/94.5 H; 357/16; 357/18
[58] Field of Search .................... 331/94.5 H; 357/16, 357/18

[56] References Cited

U.S. PATENT DOCUMENTS 3,982,261  9/1976  Antypas .................................. 357/16

OTHER PUBLICATIONS

Burnham et al., Applied Physics Letters, vol. 17, No. 10, 15 Nov. 1970, pp. 455–457.
Dyment et al., Applied Physics Letters, vol. 24, No. 10, 15 May 1974, pp. 481–484.
Antypas et al., (1574), J. of the Electrochemical Society, vol. 120, No. 11, Nov. 1973, pp. 1574–1577.
Antypas et al., (416), J. of the Electrochemical Society, vol. 121, No. 3, Mar. 1974, pp. 416–418.

*Primary Examiner*—Robert J. Webster
*Attorney, Agent, or Firm*—John T. O'Halloran; Peter C. Van Der Sluys; Richard A. Menelly

[57] ABSTRACT

A conventional construction of light emissive III–V semiconductor device is modified by the inclusion in the active region of the device of not more than 5 atomic percent of a group III or group V substituent of significantly different atomic radius than that of the element for which it is substituted. The microstress field in the neighborhood of dislocation in the active region produces local modification of the concentration of the substituent causing a reduction in the magnitude of the microstress field associated with these dislocations.

7 Claims, 1 Drawing Figure

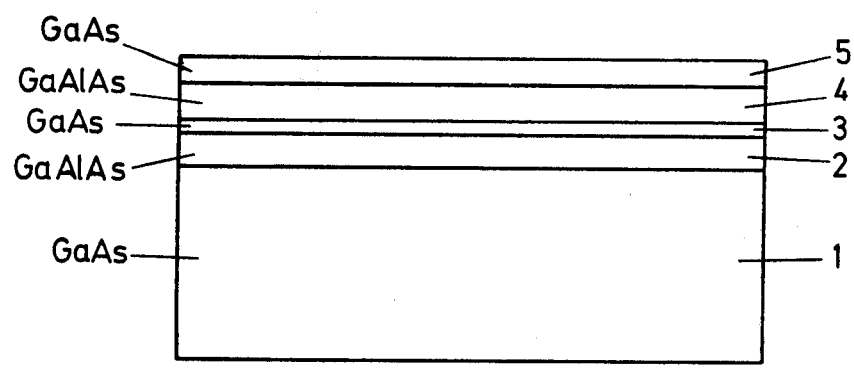

DOUBLE HETEROSTRUCTURE LASERS HAVING REDUCED MICROSTRESS

FIELD OF THE INVENTION

This invention relates to the manufacture of III-V semiconductor light emissive devices.

BACKGROUND OF THE INVENTION

One of the degredation mechanisms observed in the operation of light emissive semiconductor devices is the development of dark line defects (absorbing region). In a double heterostructure laser these dark line defects develop in or adjacent the active layer of the laser. The defects consist of a network of dislocation loops, which are believed generally to initiate a defect or dislocation incorporated into the material during its manufacture, and that the lines developed by the condensing of point defect (intersticial, vacancies, and impurity atoms) onto existing grown-in defects. Since the degredation results from the use of the device it is further believed that the device operation somehow renders the point defect concerned very mobile.

This invention is concerned with substituting atoms of different size into the host lattice. One effect of this substitution is to lock or pin the defects or dislocations that are grown into the device by relieving some microstress present around them. It is further believed that this may reduce the mobility of the point defects during device operation. This is primarily of use in the active region of the device, but may also with advantage be applied to the layers flanking the active region.

The relief of microstress and consequent dislocation pinning that is achieved by doping may be understood by considering an edge dislocation. The stresses in the neighbourhood of the dislocation increase rapidly toward the dislocation in inverse proportion to the distance from the dislocation. The stresses have both hydrostatic and shear components. With a dopant with spherical symmetry, only the hydrostatic component is relieved. The hydrostatic stress is compressional on the side of the dislocation with the extra half plane, and tensional on the other side. If during growth of the material impurity atoms are present which would normally be incorporated into the host lattice with a concentration $C_o$, then the concentration $C$ around a dislocation is given by the expression $C = C_o \exp(\beta \sin\theta / RkT)$ where $R$ and $\theta$ are cylindrical co-ordinates, and $k$ is Boltzmans constant, $T$ is the absolute temperature, and $\beta$ is an elastic interaction coefficient proportional to the difference in radii between the impurity atom and the atom in the host lattice for which the impurity atom is substituted. Thus if the substituent is larger it is present in a greater concentration in the region of tensile stress, and present in a reduced concentration in the region of compressive stress. The gradient of impurity concentration partially relieves the stresses caused by the dislocation and also pins the dislocation in position insofar as it creates a potential energy well for the dislocation centred on the dislocation.

The concentration required to produce a significant pinning effect depends upon the degree of mismatch between the atomic sizes. In gallium arsenide, for instance, the atomic size of aluminium is so close to that of gallium that it is not suitable, although it could be used in other semiconductor materials, such as indium arsenide. On the other hand indium and antimony are sufficiently different in size from gallium and arsenic respectively for effective pinning in gallium arsenide at concentrations of not more than a few atomic percent. A substantially similar concentration in the case of phosphorus substituted for arsenic in gallium arsenide would produce a slightly smaller effect. At this concentration any shift of the wavelength of emission is normally masked by the scatter in emission wavelengths normally encountered in batches of nominally identical devices. A much larger concentration, typically about 15 atomic %, would be required to produce a significant shift in emission wavelength.

SUMMARY OF THE INVENTION

The object of the invention is to provide a light emissive III-V semiconductor device whose operational lifetime is improved.

According to a broad aspect of the invention there is provided a light emissive III-V semiconductor device wherein the active region of the device contains a Group III or Group V substituent of significantly different atomic radius than that of the element for which it is substituted, said sustituent being present in a concentration of not more than 5 atomic %.

In a preferred embodiment the substituent is present also in layers flanking the acting region.

In a heterostructure device the substituent may be present together with another Group III or Group V substituent. These substituents being combined in such proportion to relieve not only the microstress associated with dislocation, but also the bulk stress associated with heterojunctions between materials of slightly different lattice constant.

The above and other features of the invention will become more apparent from the following description of embodiments thereof with reference to the accompanying drawing.

There follows a description of double heterostructure lasers embodying the invention in preferred forms.

BRIEF DESCRIPTION OF THE DRAWING

The accompanying schematic drawing depicts a section through the semiconductor material of a laser.

DESCRIPTION OF THE PREFERRED EMBODIMENT

The laser structure depicted in the FIGURE is made by conventional techniques of liquid epitaxy starting with an n-type GaAs substrate 1. An n-type GaAlAs layer 2, typically 1 to 2 μm thick and having the composition $Ga_{0.7}Al_{0.3}As$, is first grown on the substrate 1, and then this layer 2 is covered by a layer 3, typically about 0.2 μm thick which forms the active region of the device. Layer 3, which may be p-type or n-type, is typically GaAs, though aluminium may be present in a much smaller proportion than in layer 2. Layer 3 is covered with a layer 4 which is substantially the same composition and thickness as layer 2 with the difference that it is p-type instead of n-type. Layer 4 is covered with a further layer, layer 5, of p-type or p+-type GaAs provided for facilitating making electrical contact with the p-type side of the device. This far in the description the device is similar to known double heterostructure devices, but it is distinguished by the addition of a small quantity of indium to layer 3, and optionally a smaller quantity of layers 2 and 4. About 12 atomic % indium is added to the melt used for the growth of layer 3 in order to produce about 0.6 atomic % indium in the solid. The melts for growing layers 2 and 4 are provided with a lower proportion of indium, typically 2 atomic %, so as to give a lower proportion of indium, about 0.1 atomic %, in the grown layers. The lower concentration is because an ancillary effect of indium doping in these layers is to increase the bulk stress in the finished device. Both the indium doping and the aluminium doping of gallium arsenide have the effect of increasing the room temperature lattice constant. Indium doping of layers 2 and 4 will therefore augment the bulk stress already present on account of the aluminium.

Fortuitously the relative atomic radii of gallium, indium, arsenic, and antimony are such that substantially equivalent dislocation pinning can be achieved by replacing the indium doping with antimony doping at the same concentration in the solid.

Phosphorus, however, requires a higher concentration to approach the same degree of pinning. This is because phosphorus is closer than antimony in atomic radius to that of arsenic. The degree of dislocation pinning resulting from doping is proportional to the concentration times the square of the difference in radii; while the lattice mismatch resulting from doping is proportional to the concentration times the single power of the difference in radii. Therefore the larger the difference in radii the greater the dislocation pinning effect that can be achieved for the same measure of bulk lattice constant mismatch.

Therefore in the gallium arsenide system indium and antimony are preferred to phosphorus for dislocation pinning. For the same reason it may be predicted that boron, nitrogen, thalium and bismuth should be suitable doping materials provided that they can be conveniently incorporated into the deposited material in appropriate concentrations.

It can be advantageous to include Group III and Group V substituents in the one material as different types of dislocation can exist, some pinned more effectively by a substituent in the Group III element lattice and others pinned more effectively by a substituent in the Group V element lattice.

In general impurities added to a heterostructure to produce dislocation pinning will be added to the active layer 3 of the device, and it is of secondary importance to add the impurity to the passive layers 2 and 4. Also the impurities would normally be added in such concentrations that the bulk stresses would be at least partially relieved.

Phosphorus has the effect of reducing the lattice constant of GaAs or GaAlAs. It is therefore undesirable to add phosphorus simply to the active layer 3 of a double heterostructure laser because this increases the differential stress between layer 3 and layers 2 and 4 at room temperature. If phosphorus alone were used for dislocation pinning it would therefore be desirable to add at least as much phosphorus to layers 2 and 4 as to layer 3.

The same considerations would also apply to the addition of nitrogen or boron, since these are also smaller atomic radius substituents. However the issue is not so significant because the greater disparity in radii means that a much smaller concentration is necessary.

In the double heterostructure some of the problems of lattice mismatch resulting from the doping to achieve dislocation pinning can be alleviated by using a dopant of larger atomic radius in conjunction with another of smaller atomic radius. Thus for instance in the gallium arsenide - gallium aluminium arsenide system phosphorus may, with advantage, be used in conjunction with indium or antimony.

The presence of about 0.6 atomic % of indium or antimony in the active layer 3 provides that layer with a room temperature lattice constant substantially equal to that of $Ga_{0.7}Al_{0.3}As$. Therefore if about 0.7 atomic % indium or antimony is used in the active layer 3 and 0.1 atomic % in the two flanking layers 2 and 4 the room temperature match between the three layers is retained but lattice constant is noticeably larger than that of the underlying GaAs substrate. However this difference can be alleviated by doping the three layers 2, 3 and 4 with equal concentrations of phosphorus. Typically the phosphorus doping is about 1.2 atomic %.

In a modified form of the above described laser devices two additional GaAlAs layers are provided. These layers (not shown), which are typically 0.1 to 0.2 $\mu m$ thick, lie between the GaAs active region 3 and the two GaAlAs layers 2 and 4. In this modified structure, sometimes known as a 'localised gain region' (LGR) laser the functions of optical confinement and of electrical confinement are at least partially separated by flanking the active region with thin layers having a low aluminium concentration, typically $Ga_{0.95}Al_{0.05}As$, these layers being backed by thicker layers having a higher aluminium concentration, typically $Ga_{0.7}Al_{0.3}As$. Doping for dislocation pinning and the relief of microstress is most important for the active region, but may with advantage be applied to the inner flanking GaAlAs layers or to both the inner and the outer flanking GaAlAs layers. As with the previously described examples it is preferred to grade the doping so as to reduce the difference in lattice constants between the doped layers. Also, as previously described, it is preferred to make use of two dopants, one of larger and the other of smaller atomic radius, in such proportions that the difference in lattice constant between the grown layers and the substrate material is reduced.

It is to be understood that the foregoing description of specific examples of this invention is made by way of example only and is not to be considered as a limitation on its scope.

What is claimed is:

1. An improved double heterostructure laser of the type having an active region consisting of Group III–V material flanked by at least one layer of Group III–V material comprising:
   an additional Group III material within the active region composition for providing reduced microstress strain in the laser structure; and
   an additional Group III material within the Group III–V material of the flanking layers wherein the Group III material comprises gallium and the additional Group III material comprises indium.

2. The laser of claim 1 wherein the additional Group III material comprises boron.

3. The laser of claim 1 wherein the additional Group III material comprises thallium.

4. The laser of claim 1 wherein the active region contains an additional group V material comprising nitrogen.

5. The laser of claim 1 wherein the active region contains an additional group V material comprising bismuth.

6. The laser of claim 1 wherein the indium comprises 0.6 atomic percent of the active region composition and wherein the indium comprises 0.1 atomic percent of the composition of the flanking layers.

7. The laser of claim 6 wherein the 0.6 atomic percent indium is substituted for 0.6 atomic percent gallium in the composition of the active region and wherein the 0.1 atomic percent indium is substituted for 0.1 atomic percent gallium in the composition of the flanking layers.

* * * * *